United States Patent
Lienert et al.

(10) Patent No.: US 7,728,101 B2
(45) Date of Patent: Jun. 1, 2010

(54) OVERCOAT LACQUER

(75) Inventors: Klaus-Wilhelm Lienert, Hamburg (DE); Gerold Schmidt, Hamburg (DE); Sascha Tödter-König, Hamburg (DE)

(73) Assignee: Altana Electrical Insulation GmbH, Wesel (DE)

( * ) Notice: Subject to any disclaimer, the term of this patent is extended or adjusted under 35 U.S.C. 154(b) by 579 days.

(21) Appl. No.: 10/588,864

(22) PCT Filed: Jan. 24, 2005

(86) PCT No.: PCT/EP2005/050383

§ 371 (c)(1), (2), (4) Date: Jul. 2, 2007

(87) PCT Pub. No.: WO2005/075586

PCT Pub. Date: Aug. 18, 2005

(65) Prior Publication Data

US 2008/0035016 A1 Feb. 14, 2008

(30) Foreign Application Priority Data

Feb. 9, 2004 (DE) .................. 10 2004 006 239

(51) Int. Cl.
*C08G 73/16* (2006.01)
*C08G 73/10* (2006.01)

(52) U.S. Cl. .............. 528/289; 528/368; 523/500; 523/505; 524/606; 106/14.16; 427/58

(58) Field of Classification Search .......... 523/500; 524/606; 528/289, 368; 106/14.16
See application file for complete search history.

(56) References Cited

U.S. PATENT DOCUMENTS

| 3,211,585 A | 10/1965 | Meyer et al. |
| 3,523,820 A | 8/1970 | Sheffer |
| 3,660,327 A | 5/1972 | Loncrini et al. |
| 4,983,716 A | 1/1991 | Rao et al. |
| 5,854,334 A | 12/1998 | Schink et al. |
| 6,552,091 B1 | 4/2003 | Boinowitz et al. |

FOREIGN PATENT DOCUMENTS

| WO | 96/27643 | 9/1996 |
| WO | 02/081544 | 10/2002 |

OTHER PUBLICATIONS

Database WPI, Section CH, Week 197539, Derwent Pub. LTD, London, GB; XP002323459 & JP 50 069193 A (Teijin LTD), Jun. 9, 1975.
Database WPI, Section CH, Week 197828, Derwent Pub. LTD, London, GB; XP002323460 & JP 53 061629 A (Mitsubishi Electric Corp), Jun. 2, 1978.

*Primary Examiner*—Tae H Yoon
(74) *Attorney, Agent, or Firm*—Friedrich Kueffner

(57) ABSTRACT

The invention relates to an overcoat lacquer containing a) at least one binding agent containing alkyd resins made from tris-(2-hydroxylethyl)-isocyanurate, 2,6-naphthaline dicarboxylic acid, drying fatty acids, and, optionally, other components known from alkyd resin chemistry, b) at least one solvent or at least one technical solvent or mixture thereof based on hydrocarbon and c) at least one siccative or at least one mixture of siccatives or several anti-skin agents.

8 Claims, No Drawings

OVERCOAT LACQUER

The present invention relates to an air-drying varnish particularly suitable for coating flat modules in electronics, hybrids, SMD modules, and assembled printed circuit boards which are subject to an elevated thermal load. The varnish can also be used for impregnating electrical windings or as a protective varnish for electrical windings.

A coating varnish for flat-modules, hybrids, SMD modules, and other components employed on printed circuit boards is required to protect the varnished components from moisture, chemicals, dust, etc. The further intention is that the protective coat should increase the security of electronic modules with respect to climate and tracking current. The thermal load-bearing capacity must be appropriate to the field of use. Typical varnishes have a temperature index (TI) of 130. The desire, particularly on the part of the automobile industry, is for a coating varnish having a TI of greater than 155. Effective adhesion to a variety of substrates is assumed as a given. Processing is typically by selection, coating, selective immersion, spraying or injection process. With a varnish of this kind, dry film thicknesses of 10 ηm or more are obtained.

The state of the art is the use of air-drying or oven-drying varnishes. The binder is typically an alkyd resin, an acrylic resin or a polyurethane resin. Alkyd resins for surface protection have been known for a long time and have also been described for a long time (W. Oburger, Die Isolierstoffe der Elektrotechnik, Springer 1957; W. Tillar Shugg, Handbook of Electrical and Electronic Insulating Materials IEEE Press 1995).

Alkyd resins can be formulated as such or else as modified resins (imide, urethane) without or with additional curing agents (melamine resins, phenolic resins, (blocked) isocyanates) in organic solvents. These varnishes are of low viscosity and in addition to binders comprise catalysts and additives. Alkyd resins are known to be not particularly temperature-stable, but have the advantage that, given the correct binder composition, they are air-drying and hence allow cost-effective processing.

Where tris(2-hydroxyethyl)isocyanurate is incorporated into branched polyester resins or modified polyester resins, products are obtained which have a relatively high thermal rating (K-W. Lienert, Poly(ester-imide)s for industrial use, p. 48, in Progress in polyimide chemistry, vol. 141, 1999).

Moreover, EP 0 813 580 describes how the use of 2,6-naphthalenedicarboxylic acid structures instead of the typical terephthalate structures in polyesters and modified polyesters likewise leads to an improvement in thermal properties.

The problem addressed by the present invention was that of providing an air-drying, low-viscosity coating varnish for coating flat modules, hybrids, SMD modules, etc., which can be processed on the typical lines and has a TI to IEC 60216 of at least 155.

This problem is solved by a coating varnish which comprises
a) at least one binder comprising alkyd resins synthesized from tris(2-hydroxyethyl)isocyanurate, 2,6-naphthalene-dicarboxylic acid, drying fatty acids, and, if desired, further components known from alkyd resin chemistry,
b) at least one solvent or at least one technical solvent mixture thereof comprising at least one hydrocarbon-containing solvent, and
c) at least one siccative or at least one mixture of siccatives and one or more antiskinning agents.

In accordance with the invention the alkyd resin is dissolved in the solvents together with the siccatives and the other auxiliaries. This produces a varnish which, depending on the binder concentration and solvent composition, has different viscosities. Typically, varnishes for the coating of flat modules in electronics, hybrids and SMD modules have viscosities of between 100 mPas and 400 mPas, depending on application, processing technology, and desired coat thickness.

In accordance with the invention component a) comprises at least one binder which is prepared by the reaction of tris(2-hydroxyethyl)isocyanurate, 2,6-naphthalene-dicarboxylic acid, drying fatty acids, and other components known from alkyd chemistry. Preferably component a) consists of this binder.

Preferably the binder contains
33.0%-50.0% of tris(2-hydroxyethyl)isocyanurate, preferably 37.0%-45.0%, more preferably 38.0%-43.0%
14.0%-20.0% of dimethyl 2,6-naphthalene-dicarboxylate, preferably 15.0%-19.0%, more preferably 16.0%-18.0%
34.0%-47.0% of tall oil fatty acid, preferably 38.0%-44.0%, more preferably 40.0%-42.0%.

This resin may in accordance with the invention contain 1.0%-15.0% of a modifier, an example being a mixture of tolylene 2,6- and 2,4-diisocyanate.

The preparation of alkyd resins is common knowledge and can be looked up in various standard works of the chemical literature. It involves heating the components, with or without an esterification catalyst, typically at temperatures between 190 and 240° C. The reaction is typically carried out under inert gas. In order to facilitate the expulsion of the water formed it is possible to use an azeotrope, entrainer and/or vacuum. The monitoring of the course of condensation is typically accomplished by determining the acid number and/or the condensation viscosity.

Constituents of an alkyd resin are polyols, polycarboxylic acids, and fatty acids. Polyols which can be used include, in addition to the tris(2-hydroxyethyl)isocyanurate of the invention, ethylene glycol, propylene glycol, glycerol, trimethylolpropane, etc. Preference is given in accordance with the invention to the use of tris(2-hydroxyethyl)isocyanurate.

Polycarboxylic acids which can be used, in addition to the 2,6-naphthalenedicarboxylic acid of the invention, are phthalic acid, isophthalic acid, terephthalic acid, etc. Typically the corresponding dimethyl esters or acid anhydrides are used in order to accelerate the synthesis of the binder. Preference is given to using 2,6-naphthalene-dicarboxylic acid or dimethyl 2,6-naphthalenedicarboxylate.

As a fatty acid, for an air-drying system, a drying fatty acid or a mixture of fatty acids is used, such as linolic acid, linolenic acid, oleic acid, tall oil fatty acid, etc. Instead of a polyol and a fatty acid it is also possible when preparing the binders of the invention to boil drying oils, examples being linseed oil, coating-grade soybean oil, etc.

The alkyd resins synthesized from the components described may in accordance with the invention be modified.

For modifying alkyd resins it is possible to use a variety of components which react with the hydroxyl groups and/or the acid groups of the resins. Reacting with the hydroxyl groups are mono- or polyisocyanates, which may be aromatic, aliphatic or cycloaliphatic, such as phenyl isocyanate, naphthyl isocyanate, tolylene 2,6- and 2,4-diisocyanate or a mixture of both, 4,4'-diisocyanatodiphenylmethane, hexamethylene 1,6-diisocyanate, isophorone diisocyanate, etc. Other components which react with the hydroxyl groups are, for example, resoles or melamine resins. A large number of such compounds are available industrially.

The acid group of the alkyd resins is able to react readily with epoxy resins. Examples of suitable epoxy resins include bisphenol A diglycidyl ether and bisphenol F diglycidyl ether, limonene oxide, 3,4-epoxycyclohexylmethyl 3',4-epoxycyclohexanecarboxylate, and also monofunctional oxiranes such as phenyl glycidyl ether, for example, glycidyl ethers of long-chain alcohols or of polyalkylene glycols.

A further modification of the alkyd resins consists in their boiling with natural drying oils, with natural resins, with maleic anhydride, etc. The recitation of these possibilities is by way of example and does not restrict the varnish binders of the invention.

The binder of the invention may be prepared with preference from

- 33.0%-50.0% of tris(2-hydroxyethyl)isocyanurate, preferably 37.0%-45.0%, more preferably 38.0%-43.0%
- 14.0%-20.0% of dimethyl 2,6-naphthalene-dicarboxylate, preferably 15.0%-19.0%, more preferably 16.0%-18.0%
- 34.0%-47.0% of tall oil fatty acid, preferably 38.0%-44.0%, more preferably 40.0%-42.0%.

This resin may in accordance with the invention be modified with 1.0%-15.0% of a modifier, e.g. a mixture of tolylene 2,6- and 2,4-diisocyanate.

Suitable solvents or solvent mixtures (component b)) include aliphatic and/or aromatic hydrocarbon mixtures which are known in varnish chemistry, such as Shellsol D25 and D40, Solvesso 100 and Solvesso 150, toluene, xylene, and distillation cuts comprising them. These solvents are typically but not mandatorily used in a mixture with esters, ketones, lactones, and other typical varnish solvents. The following recitation is intended to illustrate the diversity of compounds which can be employed: esters for mention here include ethyl, isopropyl, and butyl acetate; ketones such as ethyl methyl ketone, isopropyl methyl ketone, isoamyl methyl ketone, and isophorone can likewise be employed. Gamma-butyrolactone is a representative of the class of the lactones. Other typical varnish solvents are hydroxy ethers such as methoxypropanol and -butanol, ether esters, such as methoxyprop-2-yl acetate, and cyclic esters such as propylene carbonate and glycerol carbonate, for example. Reference may be made hereby to the technical literature relating to solvents for varnishes.

Component c) comprises metal salts, such as lead, cobalt and zirconium octoate, manganese, vanadium, and calcium naphthenate, or combinations of these siccatives, which catalyze the crosslinking of the alkyd resins by atmospheric oxygen.

The antiskinning agents included in component c), such as ethyl methyl ketoxime, tocopherol, Ascinin® Antiskin VP 242 (available through Borchers, Germany), prevent the formation of a skin layer on the varnish surface during the storage of the varnishes of the invention in containers. Typically, and also dependent on the use of the varnish, alkyd resin varnishes may if desired include co-catalysts, corrosion inhibitors, defoamers, flow control agents, and wetting agents. Reference may be made hereby to the relevant varnish handbooks.

For preparing the coating varnish of the invention it is preferred to dissolve the existing binder in component b), to carry out modification if desired, to carry out heating if desired, and then to add component c).

The coating varnish of the invention can be used with preference for coating electrical wires, electrical windings, as a coating in flat modules in electronics, hybrids, SMD modules, assembled printed circuit boards, and for impregnating electrical windings.

The invention is described in more detail below with reference to examples. Testing takes place in accordance with DIN and IEC standards.

EXAMPLES

Example 1

1044 g of tris(2-hydroxyethyl)isocyanurate (THEIC), 460 g of dimethyl 2,6-naphthalenedicarboxylate (NDC), 1085 g of tall oil fatty acid, and a typical esterification catalyst are used to prepare an alkyd resin having an acid number of less than 5 mg KOH/g. The resin is dissolved in 700 g of methoxyprop-2-yl acetate and 1700 g of coatings-grade benzine. The solution is admixed with 208 g of a technical mixture of tolylene 2,6- and 2,4-diisocyanate and heated until the IR band of the NCO group is no longer visible. 10 g of lead octoate and 10 g of cobalt octoate and also 44 g of ethyl methyl ketoxime are added. Using about 354 g of methoxyprop-2-yl acetate and about 852 g of coatings-grade benzine, the varnish is adjusted to an ISO 6 flow time of 38 s.

A printed circuit board is immersed in the varnish and then cured at 90° C. for 1 hour. The film formed is smooth and tack-free. The cross-cut amounts to Gt 0 B (DIN 53151). The breakdown resistance to DIN EN 60464-2 is found to be $1*10^{16}$ $\Omega cm^{-1}$. The TI, via the loss of mass on the glass fiber to IEC 60216 is 166.

The varnish is used to impregnate drilled rods to IEC 61033 (method A), and, after curing (1 hours at 110° C.), the baking resistance is measured. At 23° C. it is 47 N.

Example 2

522 g of (THEIC), 210 g of NDC, 498 g of tall oil fatty acid and 56 g of a technical mixture of tolylene 2,6- and 2,4-diisocyanate are used as described in Example 1 to prepare a resin and are formulated analogously with the indicated solvents, siccatives, and antiskinning agent. The varnish is readily varnishable and curable.

The TI via the loss of mass on the glass fiber to IEC 60216 is 157.

Comparative Example 3

The experiment from Example 1 is repeated except that the resin is not modified with the mixture of tolylene 2,6- and 2,4-diisocyanate. After varnishing and curing, tacky films are obtained. Further tests are therefore unnecessary.

Comparative Example 4

1044 g of (THEIC), 314 g of isophthalic acid, 1085 g of tall oil fatty acid and 208 g of a technical mixture of tolylene 2,6- and 2,4-diisocyanate are used as described in Example 1 to prepare a resin and are formulated analogously with the indicated solvent, siccative, and antiskinning agent amounts. The varnish is readily varnishable and curable.

The TI via the loss of mass on the glass fiber to IEC 60216 is only 140.

Comparative Example 5

536 g of trimethylolpropane, 460 g of NDC, 1085 g of tall oil fatty acid and 208 g of a technical mixture of tolylene 2,6- and 2,4-diisocyanate are used as described in Example 1 to prepare a resin and are formulated analogously with the indicated solvent, siccative, and antiskinning agent amounts. The varnish is readily varnishable and curable.

The TI via the loss of mass on the glass fiber to IEC 60216 is only 139.

Comparative Example 6

536 g of trimethylolpropane, 314 g of isophthalic acid, 1085 g of tall oil fatty acid and 208 g of a technical mixture of tolylene 2,6- and 2,4-diisocyanate are used as described in Example 1 to prepare a resin and are formulated analogously with the indicated solvent, siccative, and antiskinning agent amounts. The varnish is readily varnishable and curable.

The TI via the loss of mass on the glass fiber to IEC 60216 is only 132.

The invention claimed is:

1. A coating varnish comprising
   a) at least one binder consisting of an alkyd resin synthesized from
      1. 33.0%-50.0% by weight of tris(2-hydroxyethyl)isocyanurate
      2. 14.0%-20.0% by weight of dimethyl 2,6-naphthalenedicarboxylate,
      3. 34.0%-47.0% by weight of tall oil fatty acid
      4. 1.0%-15.0% by weight of modifier,
      the percentages by weight adding up in each case to 100.0% by weight
      and the modifier being a mixture of tolylene 2,6- and 2,4-diisocyanate,
   b) at least one solvent or solvent mixture comprising at least one hydrocarbon-containing solvent mixture, and
   c) at least one siccative or at least one mixture of siccatives and one or more antiskinning agents.

2. The coating varnish of claim 1, wherein component b) comprises aliphatic or aromatic hydrocarbon mixtures or mixtures thereof.

3. The coating varnish of claim 1, wherein component b) comprises a further solvent from the class of the esters, ketones, lactones or hydroxyl ethers, ether esters, cyclic esters.

4. The coating varnish of claim 1, wherein component c) comprises lead, cobalt or zirconium octoate, manganese, vanadium or calcium naphthenate or combinations of one or more of these siccatives.

5. The coating varnish of claim 1, wherein component c) comprises as antiskinning agents ethyl methyl ketoxime, tocopherol, or mixtures of these substances.

6. The coating varnish of claim 1, wherein component c) further comprises co-catalysts, corrosion inhibitors, defoamers, flow control agents, and wetting agents.

7. A method for coating electrical wires and electrical windings, comprising applying the coating varnish of claim 1 onto the electrical wires and electrical windings.

8. A method for impregnating electrical windings, comprising applying the coating varnish of claim 1 as a coating over flat modules in electronics, hybrid coils, surface mount device modules, and assembled printed circuit boards.

* * * * *